Oct. 29, 1963 F. LEE 3,109,107

SWEEP GENERATION BY CONSTANT CURRENT CAPACITIVE DISCHARGE THROUGH TRANSISTOR

Filed May 17, 1960

INVENTOR
FRED LEE
BY [signature]
ATTORNEY

United States Patent Office 3,109,107

Patented Oct. 29, 1963

3,109,107

SWEEP GENERATION BY CONSTANT CURRENT CAPACITIVE DISCHARGE THROUGH TRANSISTOR

Fred Lee, Sunnyvale, Calif., assignor to Sylvania Electric Products Inc., a corporation of Delaware Filed May 17, 1960, Ser. No. 29,678
4 Claims. (Cl. 307—88.5)

This invention is concerned with electronic pulse circuits and particularly with linear sweep generators.

A critical requirement for many applications of electronics is a sweep generator which gives an output voltage waveform, part of which varies linearly with time. Such a waveform is commonly called a sweep voltage. Some of the areas in which linear sweep circuits find utility are oscilloscopes, radar, television indicators, precise time measurements, and time modulation.

Many types of sweep circuits are presently available. Some have output waveforms which are linear for such a short time that they cannot be used for many important applications; other rise exponentially so that linearity must be approximated from the exponential curve. The Miller Integrator and the Bootstrap Circuit are two available devices which give fairly good linearity but they are relatively complicated in structure and operation.

Accordingly, a primary object of the present invention is to provide for electronic devices a relatively simple linear sweep generator and, specifically, one which will give sweeps of excellent linearity for a duration of time up to 10 seconds.

With these objects in mind, one illustrative embodiment of the invention is featured by taking advantage of the constant current characteristics of a transistor to discharge a capacitor and thus produce the desired linear waveform.

Other objects, features, and embodiments of the invention will be apparent from the following description and reference to the accompanying drawings wherein:

FIG. 1(*a*) is a schematic diagram of a PNP transistorized linear sweep generator embodying the invention;

FIG. 1(*b*) is an NPN transistorized equivalent of the circuit of FIG. 1(*a*);

Figures 1A, 1B, 2:
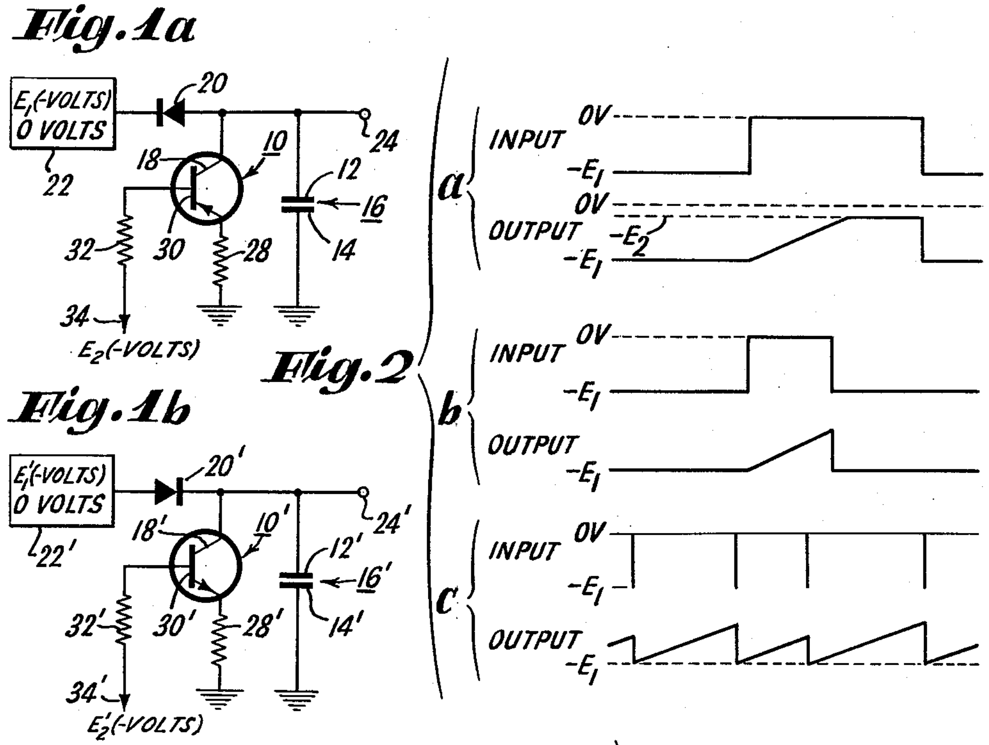
FIGS. 2(*a–c*) are a series of diagrammatic representations of the output response of the circuit of FIG. 1(*a*) to various types of signal inputs.

The linear sweep generator of FIG. 1(*a*) features a PNP transistor 10 connected across the plates 12 and 14 of a capacitor 16. The collector 18 of the transistor 10 is connected, through a forwardly biased diode 20, to an input signal source 22 and, in common with plate 12 of capacitor 16, to an output terminal 24. Plate 14 of capacitor 16 and the emitter 26 of transistor 10 are connected, the latter through a resistor 28, to ground; and, the base 30 of the transistor is connected, through a resistor 32, to a bias potential terminal 34.

The following values and commercial identities of components are recommended for the sweep generator disclosed.

| | |
|---|---|
| Potential at source 22 | −19 or 0 volts. |
| Transistor 10 | 2N404. |
| Diode 20 | 1N459. |
| Resistor 32 | 47K. |
| Resistor 28 | Variable 0 to 1M ohms. |
| Capacitor 16 | Variable $\mu$f range. |
| Potential at terminal 34 | −15 v. |

The sweep may be lengthened by increasing either resistor 28 or capacitor 12. If the resistance becomes too high, however, there is noticeable non-linearity in the sweep. Consequently, the capacitance, which does not present this problem, is preferably increased rather than the resistance.

The input signal from source 22 varies between two voltage levels. The lower level, $-E_1$, e.g. −19 v., determines the starting point of the sweep and is limited by the collector voltage rating of the transistor; the upper level should be zero volts or higher. This input signal may be provided in several different types of waveforms, some of which are shown in FIGS. 2(*a–c*).

As long as the lower level is present at the input, collector current is supplied through the forward biased silicon diode 20. The magnitude of the collector current is determined by the transistor forward bias voltage at terminal 34, and resistors 28 and 32. This voltage holds transistor 10 ON at all times. It is relatively independent of the lower voltage level of the signal from source 22. Once the capacitor 12 is fully charged the potential across it, which is the output voltage, is equal to the lower voltage level of the signal from source 22.

When the voltage level of the signal from source 22 swings to zero or a positive value, diode 20 is biased in a reverse direction and for all practical purposes becomes an open circuit. The transistor collector voltage, and thus the collector current, is now derived from capacitor 16. As the capacitor discharges, the potential across this capacitor is reduced at a rate proportional to the discharge current through the transistor. Since this current is relatively independent of collector potential, it remains nearly constant. Meanwhile, the output voltage at terminal 24 becomes less negative at a linear rate until it approaches the bias potential at terminal 34, i.e. $E_2$. At this time, conduction through transistor 10 stops decreasing and tapers off to a constant value which is determined by $E_2$ and resistor 28, and the remaining charge on capacitor 16 remains constant until the input level once again falls to $E_1$.

As shown in FIGS. 2(*a*), 2(*b*) and 2(*c*), respectively, the lower level $E_1$ of the signal from source 22 may be a square wave of variable duration, or a pulse, provided the duration of the signal is long enough or the impedance of the source low enough to charge fully the capacitor 16 before the pulse ends. Thus, the linear sweep continues as long as the input signal is at 0 level and it terminates when the input returns to $-E_1$. Hence it may taper off within the time duration of a pulse, as in FIG. 2(*a*); be coextensive with a pulse, i.e. measure pulse duration as in FIG. 2(*b*); or measure, by the amplitude to which it rises, the time interval between pulses as in FIG. 2(*c*).

Figure 3:
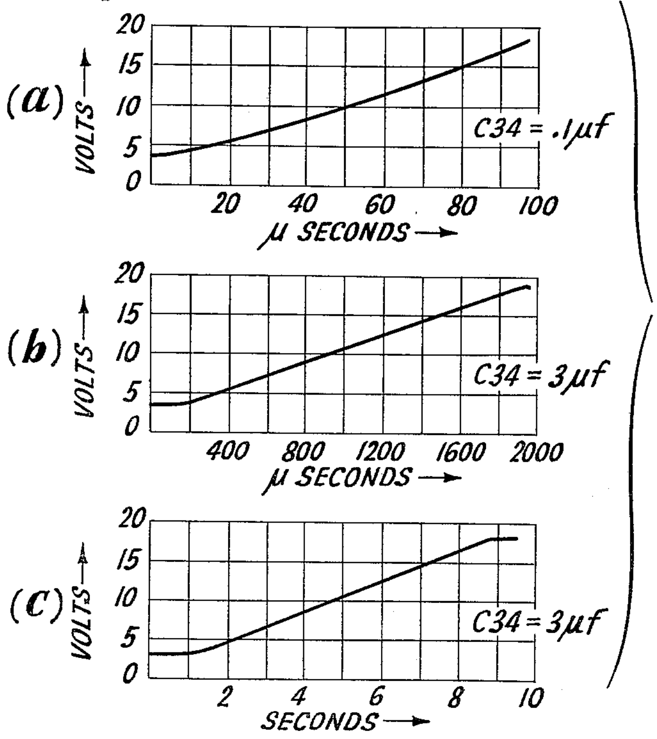
FIGS. 3(*a–c*) are a series of diagrammatic reproductions of various oscillograms showing waveforms produced by a linear sweep generator constructed in accordance with the invention.

The diagrams of FIGS. 3(*a*), 3(*b*), and 3(*c*), are representations of oscillograms showing extremely linear sweeps of up to ten full seconds duration produced by a sweep generator of the type herein shown and described.

The PNP circuit shown in FIG. 1(*a*) and featured in the preceding description may be altered to the NPN configuration of FIG. 1(*b*) with reversal of signal potentials, current flow, etc. Similarly, other apparent substitutions, modifications and embodiments of the invention are within the scope of the following claims.

What is claimed is:

1. A linear sweep generator comprising: a capacitor having first and second plate electrodes; a transistor having collector, base and emitter electrodes; an input terminal; an output terminal; means connecting the collector of said transistor and one plate of said capacitor, in common, to said output terminal; isolating diode means connecting said collector and said same one plate electrode, in common, to said input terminal; a source of bias potential adequate to maintain said transistor in constantly conducting condition; means connecting said bias source to said base electrode; a source of reference potential; and, means connecting said emitter and the other of said capacitor plates to said reference potential source.

2. A linear sweep generator comprising: a capacitor having first and second plate eletcrodes; a transistor having collector, base and emitter electrodes; an input terminal; an output terminal; means connecting the collector of said transistor and one plate of said capacitor to said output terminal; semiconductor means connecting said collector and said same one plate electrode to said input terminal; a source of bias potential adequate to maintain said transistor in constantly conducting condition; means connecting said bias source to said base electrode; a source of reference potential; and, means connecting said emitter and the other of said capacitor plates to said reference potential source.

3. A linear sweep generator comprising: means for providing an input signal having first and second voltage reference levels; means for storing the potential of one of said signal levels; isolating diode means connecting said reference voltage level means to said storage means; and, a continuously ON transistor connected to discharge said storage means, said transistor having a substantially constant current characteristic regardless of the amplitude of said stored potential.

4. A linear sweep generator comprising: means for providing an input signal having first and second voltage reference levels; capacitance means for storing the potential of one of said signal levels; isolating diode means connecting said reference voltage means to said capacitance means; and, a continuously ON transistor connected to discharge said capacitance means, said transistor having a substantially constant current characteristic regardless of the amplitude of said stored potenial.

References Cited in the file of this patent

UNITED STATES PATENTS

| | | |
|---|---|---|
| 2,891,173 | Helbog | June 16, 1959 |
| 2,923,837 | Willett | Feb. 2, 1960 |
| 2,933,623 | Jones | Apr. 19, 1960 |
| 3,013,164 | Greenberg | Dec. 12, 1961 |